United States Patent
Natarajan et al.

(10) Patent No.: US 7,291,552 B2
(45) Date of Patent: Nov. 6, 2007

(54) MULTI-LAYER FILM STACK FOR EXTINCTION OF SUBSTRATE REFLECTIONS DURING PATTERNING

(75) Inventors: Sanjay S. Natarajan, Portland, OR (US); Sean W. King, Hillsboro, OR (US); Khaled A. Elamrawi, Hillsboro, OR (US)

(73) Assignee: Intel Corporation, Santa Clara, CA (US)

( * ) Notice: Subject to any disclaimer, the term of this patent is extended or adjusted under 35 U.S.C. 154(b) by 0 days.

(21) Appl. No.: 11/300,023

(22) Filed: Dec. 13, 2005

(65) Prior Publication Data

US 2006/0094251 A1 May 4, 2006

Related U.S. Application Data

(63) Continuation of application No. 09/750,734, filed on Dec. 27, 2000, now Pat. No. 7,172,960.

(51) Int. Cl.
*H01L 21/4763* (2006.01)
(52) U.S. Cl. .................. 438/636; 257/E21.029
(58) Field of Classification Search .................. 438/636
See application file for complete search history.

(56) References Cited

U.S. PATENT DOCUMENTS

| | | | |
|---|---|---|---|
| 5,468,342 A | 11/1995 | Nulty et al. | |
| 5,565,384 A | 10/1996 | Havemann | |
| 5,639,687 A | 6/1997 | Roman et al. | |
| 5,792,703 A | 8/1998 | Bronner et al. | |
| 5,840,624 A | 11/1998 | Jang et al. | |
| 5,893,752 A * | 4/1999 | Zhang et al. | 438/687 |
| 6,037,276 A | 3/2000 | Lin et al. | |
| 6,042,999 A | 3/2000 | Lin et al. | |
| 6,060,380 A | 5/2000 | Subramanian et al. | |
| 6,072,237 A | 6/2000 | Jang et al. | |
| 6,127,089 A | 10/2000 | Subramanian et al. | |
| 6,174,810 B1 | 1/2001 | Islam et al. | |
| 6,214,721 B1 * | 4/2001 | Bendik et al. | 438/624 |
| 6,222,241 B1 | 4/2001 | Plat | |
| 6,350,679 B1 | 2/2002 | McDaniel et al. | |
| 6,350,700 B1 | 2/2002 | Schinella et al. | |
| 6,362,091 B1 | 3/2002 | Andideh et al. | |
| 6,383,918 B1 | 5/2002 | Ku et al. | |
| 6,383,950 B1 | 5/2002 | Pangrle et al. | |
| 6,399,480 B1 | 6/2002 | En et al. | |
| 6,420,280 B2 | 7/2002 | Plat | |
| 6,475,925 B1 | 11/2002 | Braeckelmann et al. | |
| 6,562,544 B1 | 5/2003 | Cheung et al. | |
| 6,635,583 B2 | 10/2003 | Bencher et al. | |
| 6,664,177 B1 | 12/2003 | Lin et al. | |
| 6,682,996 B1 | 1/2004 | Blosse | |
| 6,787,907 B2 * | 9/2004 | Watanabe et al. | 257/758 |
| 6,869,879 B1 | 3/2005 | Ryan | |
| 2001/0010976 A1 | 8/2001 | Plat | |
| 2001/0012689 A1 | 8/2001 | Okoroanyanwu et al. | |
| 2002/0155698 A1 * | 10/2002 | Lyer et al. | 438/636 |

* cited by examiner

*Primary Examiner*—W. David Coleman
(74) *Attorney, Agent, or Firm*—Blakely, Sokoloff, Taylor & Zafman LLP

(57) ABSTRACT

A method including introducing a dielectric layer over a substrate between an interconnection line and the substrate, the dielectric layer comprising a plurality of alternating material layers; and patterning an interconnection to the substrate. An apparatus comprising a substrate comprising a plurality of devices formed thereon; and an interlayer dielectric layer comprising a base layer and a cap layer, the cap layer comprising a plurality of alternating material layers overlying the substrate.

20 Claims, 4 Drawing Sheets
MULTI-LAYER FILM STACK FOR EXTINCTION OF SUBSTRATE REFLECTIONS DURING PATTERNING

CROSS-REFERENCE TO RELATED APPLICATION

This Application is a Continuation of co-pending U.S. patent application Ser. No. 09/750,734, filed Dec. 27, 2000 now U.S. Pat. No. 7,172,960.

BACKGROUND

1. Background

Modern integrated circuits use interconnections to connect the individual devices on a chip or to send and/or receive signals external to the chip. Popular types of interconnections include aluminum or copper interconnections (lines) coupled to devices, including other interconnections (lines) by interconnections through vias.

2. Field of the Invention

The invention relates to integrated circuit fabrication and, more particularly, to the definition and alignment of interconnections in integrated circuit structures.

Fabricating an interconnection structure to a device formed on a circuit substrate, such as an interconnection to a transistor device, typically involves introducing a photoimageable material (e.g., photoresist) over a dielectric layer insulating the device. The photoimageable material is patterned to have an opening to the dielectric above the desired point of contact for the subsequent interconnection. An etch is then used to form an opening or via through the dielectric layer to the device.

One problem with the current state of the art photoimaging technique is the formation of undesired openings in the photoimageable material due to substrate reflections of light. FIG. 1 illustrates the light scattering effect according to conventional processing. FIG. 1 shows structure 100 including substrate 110 of, for example, a semiconductor material such as silicon. Substrate 110 has, in this example, transistor devices 120 formed in active areas of the substrate. The active areas are separated from one another by shallow trench isolation (STI) 130. Dielectric material 135 such as, for example, silicon dioxide ($SiO_2$) overlies devices 120 and substrate 110. Photoimageable material 140 such as a positive photoresist overlies dielectric material 135. In this example, an opening in photoimageable material is desired over area 150 which will be an opening for a via to transistor device 120.

Referring to FIG. 1, it is shown that light directed through opening area 150 in the process of developing the photoimageable material may scatter within structure 110 and reflect off structures on substrate 110 (i.e., substrate reflections). Certain structures, such as gate electrodes and STI 130 are sufficiently reflective to reflect the scattered light and create undesired developed areas in photoimageable material 140. FIG. 1 shows undesired opening area 180 formed by reflective light 160 off a gate electrode and reflective light 170 off STI 130. Upon developing the photoimageable material, the undesired opening area 180 may be developed in such a way to create an opening to photoimageable material to dielectric material 135.

By creating undesired openings in the photoimageable material, failure modes are introduced into the circuit device processing. When these openings are later filled with interconnection material, electrical shorts may be introduced either between metal lines or on the silicon structure. Further, undesired interconnects coupled to silicon surface introduce a capacitive element in the structure.

Attempts to remedy the problem of creating undesired opening areas include placing an anti-reflective coating over the structure. Such technique, however, involves introducing an additional film which adds process cost and complexity and possibly additional defects in the process flow. Reduction of the light intensity is not a workable solution at this point as it requires approximately 27 milliJoules (mJ) to develop positive photoresist with only one to two milliJoules margin. Therefore, reducing the light intensity may result in the loss of the desired opening area, such as opening area 150.

What is needed are improved processing techniques and an improved structure that suppresses undesired reflections.

DETAILED DESCRIPTION OF THE INVENTION

The invention relates to techniques and an apparatus for forming interlayer dielectric material layers that suppress undesired substrate reflections. In one embodiment, a method includes introducing a dielectric layer over a substrate between an interconnection line and a contact point, the dielectric layer comprising a plurality of different material layers, and patterning an interconnection to the contact point. An embodiment of the apparatus includes a substrate comprising a plurality of devices formed thereon and a dielectric layer comprising a plurality of alternating material layers overlying the substrate. The apparatus also includes an interconnection line overlying the dielectric layer and coupled to at least one of the plurality of devices.

FIGS. 2-7 illustrate an example of a dielectric layer that suppresses substrate reflections. Unless otherwise specified, substrate refers to the device substrate, such as a silicon semiconductor substrate as well as a substrate having one or more interconnection lines formed thereon. In the latter case, the dielectric layer described herein is an interlayer dielectric material(s) between interconnection lines. It is recognized that the majority of substrate reflection problems occur through the primary dielectric material over the device substrate (e.g., primary dielectric material between the device substrate and the first interlayer dielectric layer). Accordingly, with reference to FIG. 2 through FIG. 7, a technique is shown of forming an interlayer dielectric over the device substrate. It is appreciated that subsequent dielectric material layers (i.e., subsequent interlayer dielectric material layers) may optionally be formed according to technique described herein, depending in part on the extent of reflections seen at the various higher levels.

Figure 2:
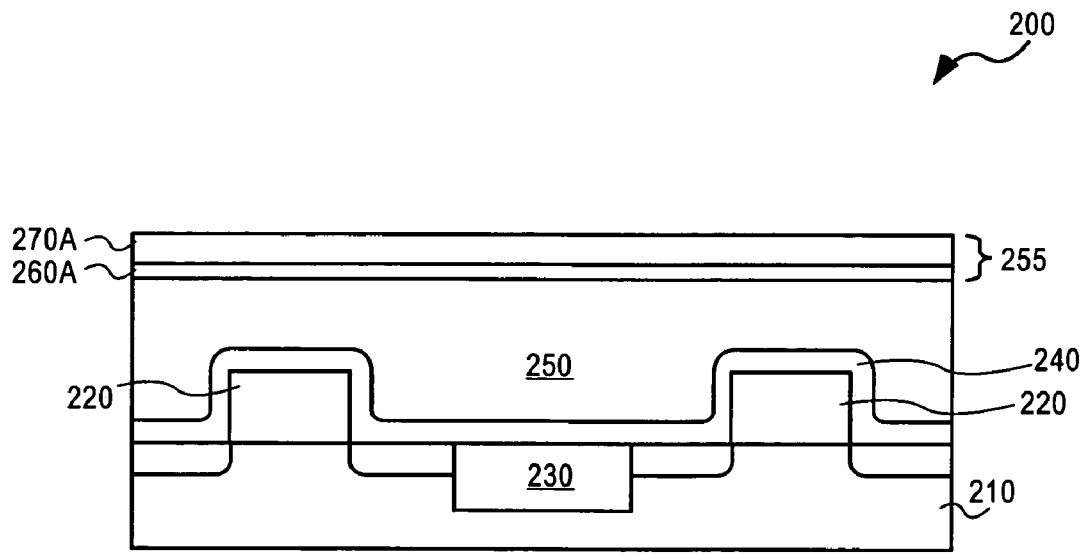
FIG. 2 shows a cross-sectional view of a portion of an integrated circuit structure including a substrate having circuit devices formed thereon, an etch stop layer overlying the substrate followed by a base dielectric material and two alternating layers of dielectric material according to an embodiment of the invention.

FIG. 2 shows structure 200 including device substrate 210 of, for example, a semiconductor such as silicon. Device substrate 210 includes a plurality of devices 220 formed in active areas thereon. Such active areas are defined, in one sense, by isolation structures such as shallow trench isolation (STI) structures 230.

Overlying substrate 210 and any devices formed thereon is etch stop layer 240. In one embodiment, etch stop layer 240 is, for example, silicon nitride material deposited by chemical vapor deposition to a thickness on the order of about 500 angstroms (Å). In one sense, etch stop layer 240 protects substrate 210 and devices formed thereon from a subsequent etching operation.

Referring to FIG. 2 overlying etch stop layer 240 is base layer 250. Base layer 250 is, for example, silicon dioxide ($SiO_2$) formed by tetraethyl orthosilicate (TEOS) or a plasma enhanced chemical vapor deposition (PECVD) source. In one embodiment, base layer 250 is doped with phosphorous or boron (e.g., by adding $PH_3$ or $B_2H_6$ during deposition) so that base layer 250 may serve as a getter (collector) of metallic contaminants.

It is appreciated that the introduction of base layer 250 over the substrate may proceed in a conformal manner leaving a non-planar substrate surface. In such cases, following the introduction and possible doping of base layer 250, structure 200 is planarized by, for example, the use of a chemical-mechanical polish. A representative thickness of planarized base layer 250 of, for example, silicon dioxide, is on the order of 1900 angstroms (Å).

It is generally desirable at this point to introduce a dielectric cap over planarized base layer 250. The dielectric cap is included, in one sense, to mask any microdefects caused by the planarization. Referring to FIG. 2, in this embodiment, dielectric cap 255 includes a plurality of alternating material layers. FIG. 2 shows dielectric cap 255 of a first dielectric material 260A and a different second dielectric material 270A. In one embodiment, dielectric material 260A is silicon oxynitride deposited to a thickness on the order of 50 Å. Dielectric material 270A is, in one embodiment, silicon dioxide deposited to a thickness on the order of about 283 Å.

Figure 3:
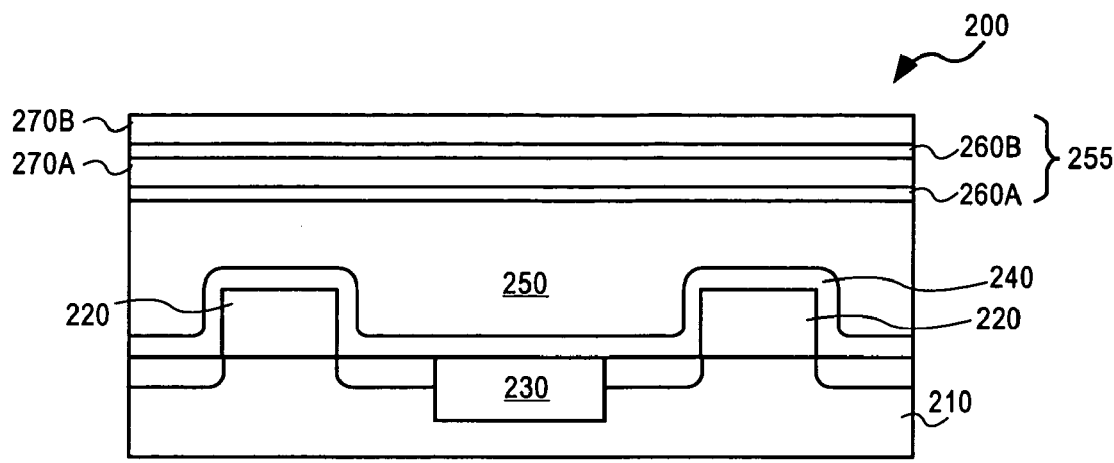
FIG. 3 shows the structure of FIG. 2 after the introduction of two additional alternating layers of dielectric material.
Figure 4:
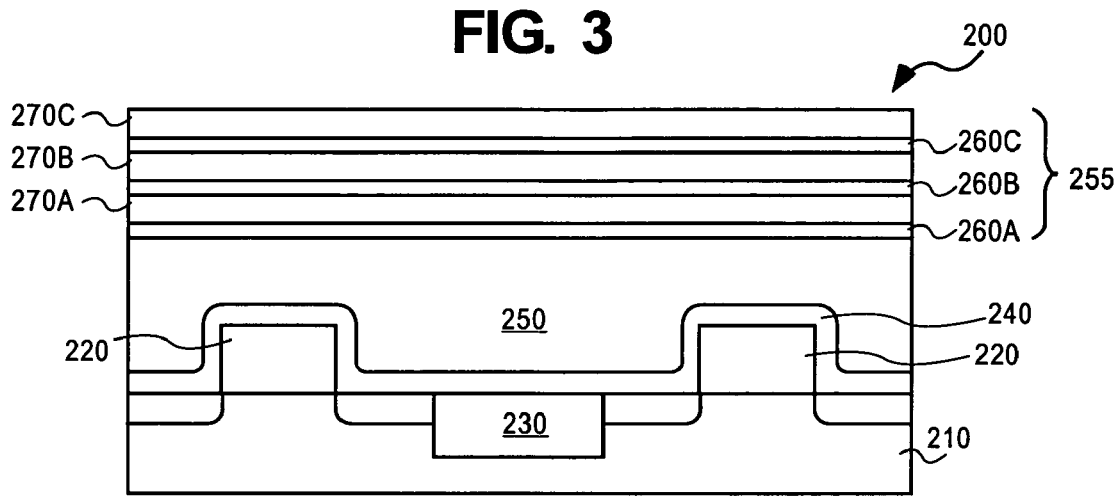
FIG. 4 shows the structure of FIG. 3 after the introduction of two additional alternating layers.
Figure 5:
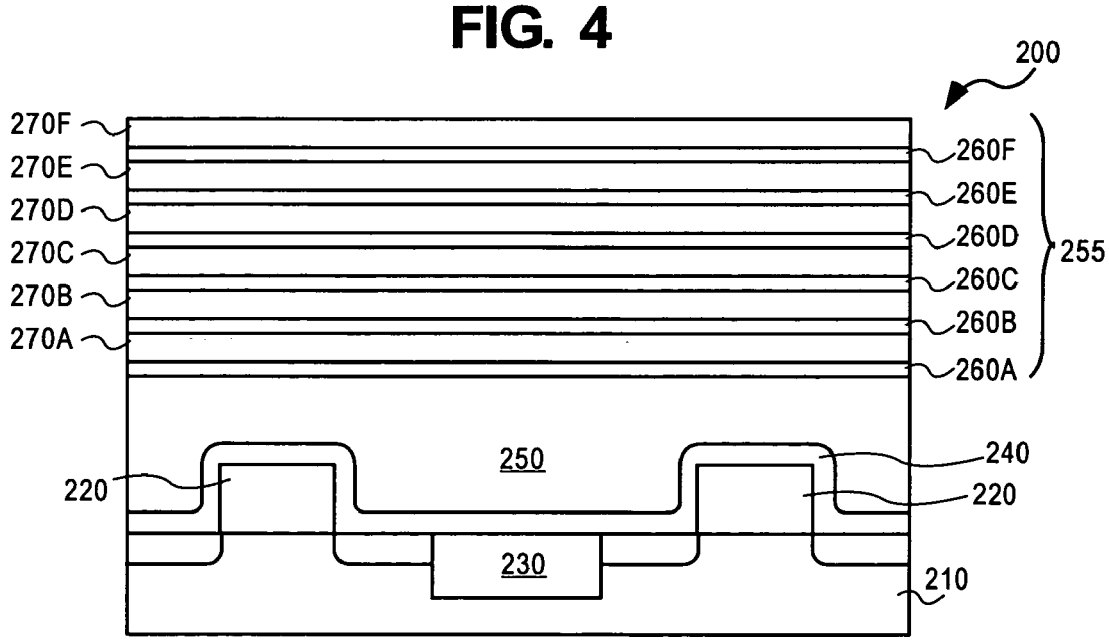
FIG. 5 shows the structure of FIG. 4 after the introduction of three additional alternating layers.

One objective of introducing dielectric cap 255 over base layer 250 is to yield a uniform interlayer dielectric film. One way to target a uniform film of dielectric cap 255 is by introducing the cap layers on a multi-station tool such as a Concept 2 Sequel™, commercially available from Novellus Systems, Inc. of San Jose, Calif. Through the use of a multi-station tool, it is possible to introduce multiple alternating layers or films of dielectric material as dielectric cap 255. FIG. 3 shows two layers or films 260A and 260B of silicon oxynitride deposited to approximately 50 Å each. Disposed between each silicon oxynitride layer or film (i.e., between layer or film 260A and 260B) are dielectric layers or films 270A and 270B of silicon dioxide introduced to a thickness on the order of about 283 Å. FIG. 4 shows three alternating layers or films of silicon oxynitride (260A, 260B, and 260C) and three layers or films of silicon dioxide (270A, 270B, and 270C). FIG. 5 shows six layers or films of silicon oxynitride (260A-260F) and six layers or films of silicon dioxide (270A-270F).

By using a multi-station tool to introduce dielectric cap 255, multiple alternating layers or films of different dielectric materials may be introduced efficiently. By selecting thicknesses of the alternating materials and the number of alternating films, cap layer 255 may be maintained within a suitable thickness range consistent with prior art structures. For example, in one embodiment, it is desired that a dielectric cap 255 has a thickness on the order of about 2,000 Å for the structure described (i.e., an overall dielectric thickness (cap+base layer+etch stop) of approximately 4,000 Å).

The structure represented in each of FIG. 2 through FIG. 5 has silicon dioxide as the ultimate layer or film and for each film thickness of the alternating layers or films, the silicon dioxide film is more than five times thicker than the silicon oxynitride film. With the selection of the alternating cap materials as silicon dioxide and silicon oxynitride, one reason it is desired to have silicon dioxide as the ultimate layer or film in the multi-layer stack is that silicon dioxide is generally a much harder material than silicon oxynitride. Accordingly, any subsequent polishing steps associated with the introduction of, for example, interconnection material over dielectric cap 255 allows for planarization (e.g., polishing) of silicon dioxide rather than silicon oxynitride. Silicon dioxide also provides better adherence to a subsequent interconnection structure such as an interconnection line of aluminum or copper.

One reason for selecting films of silicon dioxide that are more than five times thicker than the silicon oxynitride counterparts is that silicon oxynitride has a higher dielectric constant than silicon dioxide. Measurably increasing the dielectric constant of dielectric cap 255 may impair circuit performance by, for example, introducing undesired capacitance, such as metal to metal capacitance within the structure.

It has been observed that with a dielectric cap that is a two layer or film of 1,000 Å of silicon oxynitride and 1,000 Å of silicon dioxide (one to one relationship) with undesired substrate reflections from, for example, STI 231, are inhibited. Reduction of the amount of silicon oxynitride to silicon dioxide from one to one, to one to five or one to six inhibits some undesired reflections but is not as effective as the inhibiting reflectance of the one to one relationship. It has also been observed by interweaving or alternating the silicon oxynitride and silicon dioxide films as described above using significantly less silicon oxynitride, similar reflection inhibition to the one to one relationship is seen. Therefore, interweaving or alternating as described the structure shown, for example, in FIG. 5, is suitably effective at inhibiting light reflection while minimizing device performance issues while using silicon oxynitride as a portion of dielectric cap 255.

Figure 6:
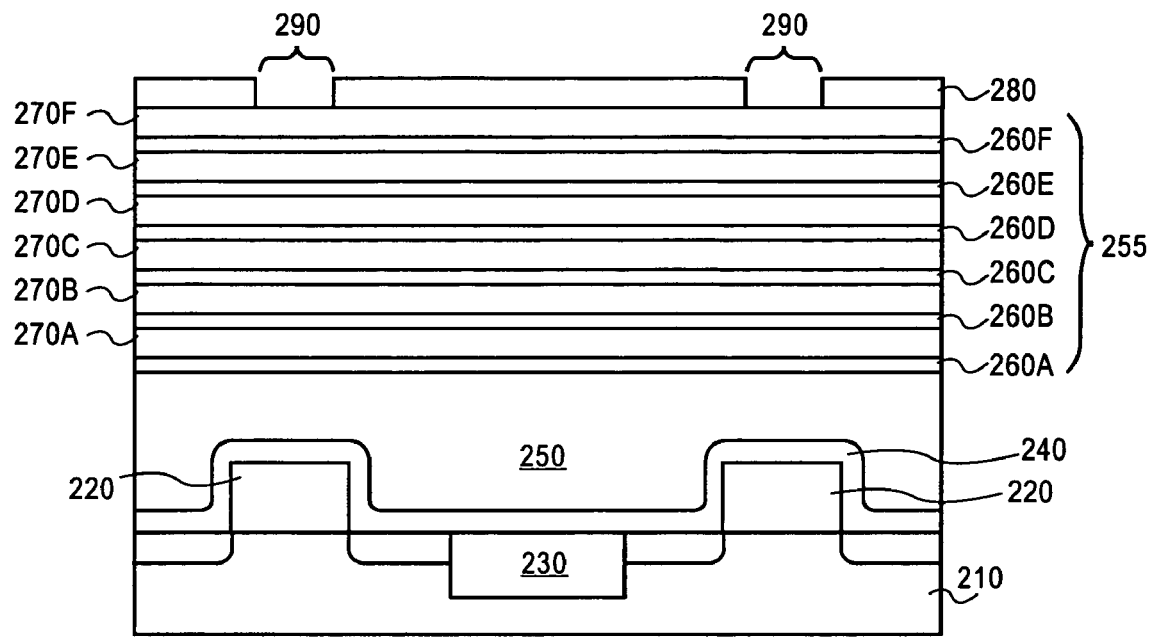
FIG. 6 shows the structure of FIG. 5 after the introduction and patterning of a photoimageable material having openings to devices in the substrate.
Figure 7:
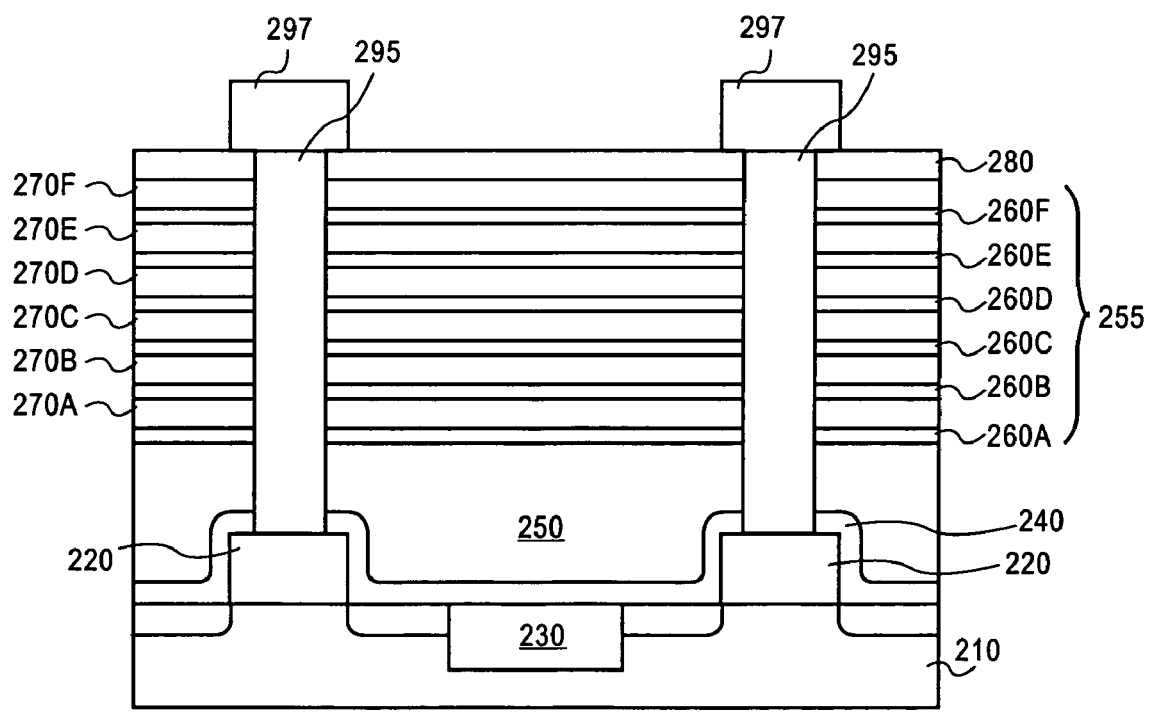
FIG. 7 shows the structure of FIG. 6 after introducing an interconnection to a contact point on the substrate.

FIG. 6 shows the structure of FIG. 5 after the introduction and patterning of photoimageable material 280. In one embodiment, photoimageable material 280 is a positive photoresist. Photoimageable material 280 is patterned to have opening areas 290 over the dielectric structure, the opening areas formed in this example to devices 220 on substrate 210. FIG. 5 also illustrates minimal undesired developed areas (none) in photoimageable material 280 as a result of undesired reflections in forming opening areas 290. FIG. 7 shows the structure of FIG. 6 after the etching of openings to devices 220 on substrate 210 and the removal of photoimageable material 280. FIG. 7 also shows the structure after the introduction of interconnection material 295 to devices 220 and interconnection material 297 over the dielectric layer. Such etching, removal of photoimageable material, and introduction of interconnection material may proceed by techniques as known in the art.

Figure 1:
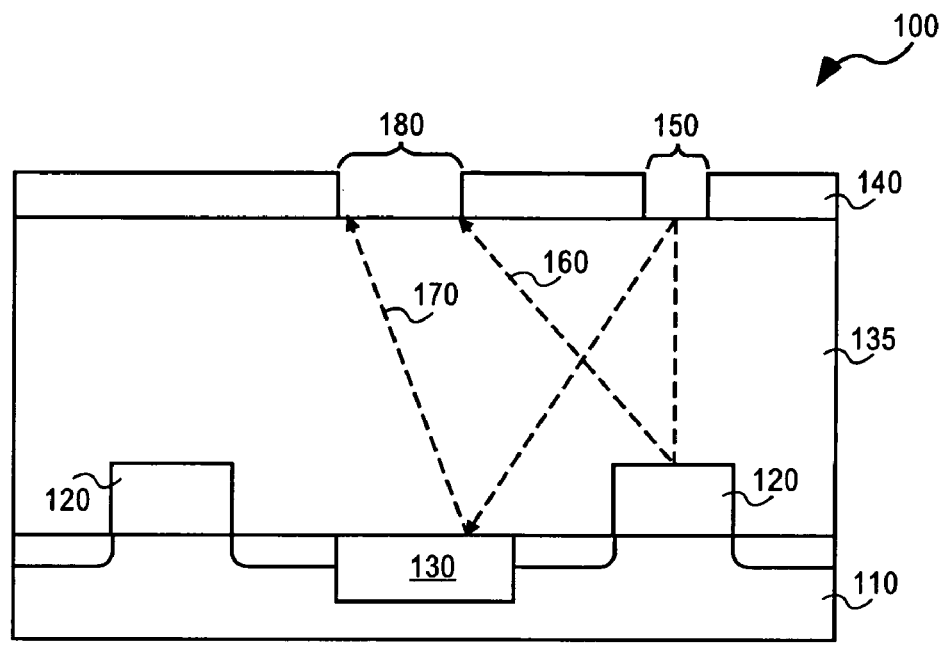
FIG. 1 shows a schematic, cross-sectional view of a portion of a prior art integrated circuit substrate and illustrates light reflections through a photoimageable material opening.
Figure 8:
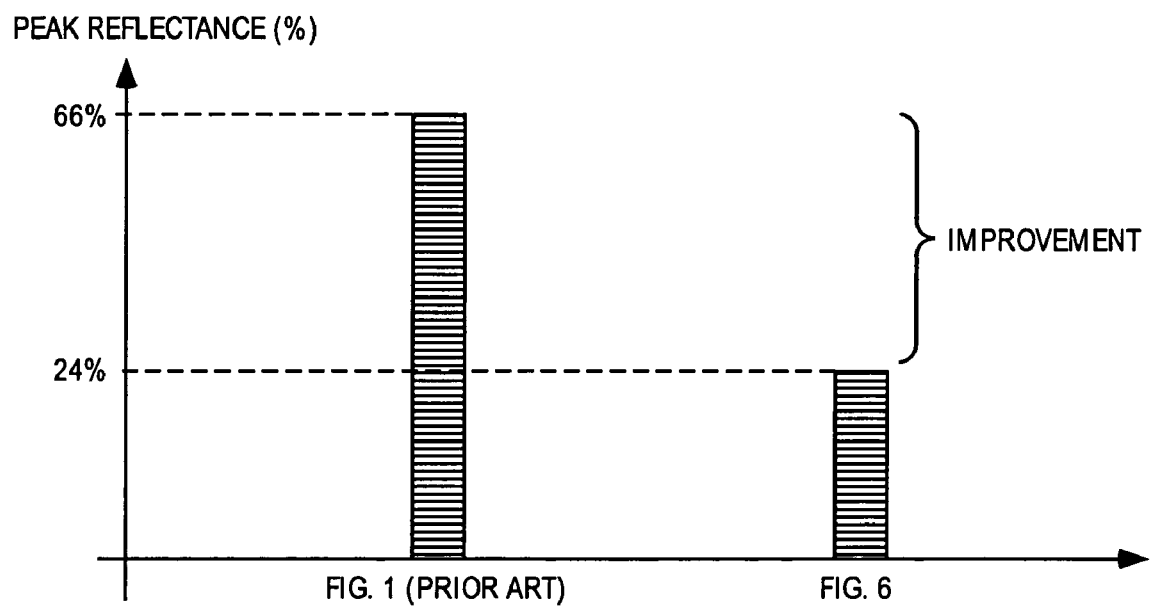
FIG. 8 is a graphical representation of the peak reflectance through a prior art substrate structure and a structure according to FIG. 5.

Although the embodiment shown in FIG. 6 illustrates no undesired opening areas due to substrate reflection, it is appreciated that the total inhibition of substrate reflection depends also on the light that is reflected. It is appreciated that in forming an opening area in, for example, photoresist material, light of possibly many wavelengths is introduced into the substrate. In this sense, the path length that the light travels is also significant in determining substrate reflections. For example, where the path length dictates that the wavelength will be modified by one-half, it is possible that such wavelength difference will be destructive and not contribute to a noticeable reflection. On the other hand, if the reflected light differs from the introduced light by a full wavelength, it is possible that such reflective light will be constructive and lead to undesired developing of photoimageable material. Thus, a complete inhibition of substrate reflections according to the techniques described herein is difficult to achieve in every case. Nevertheless, the structure described herein and the techniques of forming such structure offer an improvement over prior art techniques. FIG. 8 shows the simulated peak reflectance of a prior art dielectric material configuration such as described with respect to FIG. 1 and the accompanying text yielding a peak reflectance of approximately 66 percent. The structure shown in FIG. 6, on the other hand, has a peak reflectance of 24 percent.

In the above embodiment, a dielectric cap of interweaved layers or films of dielectric materials of silicon dioxide and silicon oxynitride is presented. It is appreciated that there may be other materials besides silicon dioxide and silicon oxynitride that may suitably substituted. Other materials may likewise be substituted for the base layer material as well. These dielectric materials include materials having a dielectric constant lower than silicon dioxide ("low k" dielectrics).

In the preceding detailed description, an improved interlayer dielectric is presented that inhibits substrate reflections. The invention is described with reference to specific embodiments thereof. It will, however, be evident that various modifications and changes may be made thereto without departing from the broader spirit and scope of the invention as set forth in the claims. The specification and drawings are, accordingly, to be regarded in an illustrative rather than a restrictive sense.

What is claimed is:

1. A method comprising:
    introducing an etch stop layer over a substrate;
    introducing a dielectric layer over the etch stop layer between an interconnection line and a contact point on the substrate, the dielectric layer comprising a plurality of at least three alternating material layers, each alternating layer comprising a first material layer and a different second material layer; and
    patterning an interconnection to the substrate, wherein the plurality of at least three alternating material layers comprising the dielectric layer collectively having a property that suppresses substrate reflections during patterning.

2. The method of claim 1, wherein the interconnection line comprises a first level interconnection line.

3. The method of claim 1, wherein the dielectric layer comprises a first dielectric layer, the method further comprising introducing a second dielectric layer between the first dielectric layer and the substrate.

4. The method of claim 1, wherein the dielectric layer has a thickness on the order of about 2000 angstroms.

5. The method of claim 1, wherein each second material layer has a thickness that is five or six times thicker than a thickness of each first material layer.

6. The method of claim 1, wherein each first material layer has a thickness of approximately 50 angstroms, and each second material layer has a thickness of approximately 283 angstroms.

7. The method of claim 1, wherein the plurality of alternating material layers comprises at least three alternating material layers, each alternating layer comprising a first material layer and a different second material layer.

8. The method of claim 2, wherein introducing a plurality of alternating material layers comprises introducing silicon dioxide as an ultimate material layer.

9. The method of claim 8, wherein introducing a plurality of alternating material layers comprises alternating silicon dioxide layers with at least one other material layers.

10. The method of claim 9, wherein the number of alternating silicon dioxide layers comprises at least six alternating material layers, each alternating layer comprising a first material layer and a different second material layer.

11. The method of claim 6, wherein each first material layer is a layer of silicon oxynitride and each second material layer is a layer of silicon dioxide.

12. The method of claim 7, wherein each second material layer has a thickness five or six times a thickness of each first material layer.

13. The method of claim 12, wherein each first material layer has a thickness of approximately 50 angstroms and each second material layer has a thickness of approximately 283 angstroms.

14. The method of claim 13, wherein each first material layer is a layer of silicon oxynitride and each second material layer is a layer of silicon dioxide.

15. A method comprising:
    introducing an etch stop layer over a substrate;
    introducing a dielectric layer over the etch stop layer between an interconnection line and a contact point on the substrate, the dielectric layer comprising a plurality of alternating material layers; and
    wherein the plurality alternating material layers comprising the dielectric layer collectively having a property that suppresses substrate reflections during patterning, and the dielectric layer has a thickness on the order of about 2000 angstroms.

16. A method comprising:
    introducing an etch stop layer over a substrate;
    introducing a dielectric layer over the etch stop layer between an interconnection line and a contact point on the substrate, the dielectric layer comprising a plurality of at least six alternating material layers, each alternating layer comprising a first material layer and a different second material layer; and
    patterning an interconnection to the substrate, wherein the plurality of at least six alternating material layers comprising the dielectric layer collectively having a property that suppresses substrate reflections during patterning.

17. The method of claim 16, wherein the dielectric layer has a thickness on the order of about 2000 angstroms.

18. The method of claim 16, wherein each second material layer has a thickness five or six times a thickness of each first material layer.

19. The method of claim 18, wherein each first material layer has a thickness of approximately 50 angstroms and each second material layer has a thickness of approximately 283 angstroms.

20. The method of claim 19, wherein each first material layer is a layer of silicon oxynitride and each second material layers is a layer of silicon dioxide.

* * * * *